United States Patent
Ma

(10) Patent No.: US 10,585,514 B2
(45) Date of Patent: Mar. 10, 2020

(54) PIXEL CIRCUIT, DISPLAY PANEL AND DRIVING METHOD THEREOF

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/084,387

(22) PCT Filed: Mar. 13, 2018

(86) PCT No.: PCT/CN2018/078838
§ 371 (c)(1),
(2) Date: Sep. 12, 2018

(87) PCT Pub. No.: WO2018/214617
PCT Pub. Date: Nov. 29, 2018

(65) Prior Publication Data
US 2019/0278407 A1    Sep. 12, 2019

(30) Foreign Application Priority Data
May 22, 2017   (CN) .......................... 2017 1 0364526

(51) Int. Cl.
*G06F 3/041* (2006.01)
*G06F 3/042* (2006.01)
(Continued)

(52) U.S. Cl.
CPC ............ *G06F 3/0412* (2013.01); *G06F 3/044* (2013.01); *G06F 3/0421* (2013.01);
(Continued)

(58) Field of Classification Search
None
See application file for complete search history.

(56) References Cited

U.S. PATENT DOCUMENTS

| 2006/0214893 A1 | 9/2006 | Tseng et al. |
| 2014/0098064 A1 | 4/2014 | Lien et al. |
| (Continued) | | |

FOREIGN PATENT DOCUMENTS

| CN | 102063217 A | 5/2011 |
| CN | 102402330 A | 4/2012 |
| (Continued) | | |

OTHER PUBLICATIONS

Second Chinese Office Action dated Apr. 17, 2019.
(Continued)

*Primary Examiner* — Nicholas J Lee
(74) *Attorney, Agent, or Firm* — Dilworth & Barrese, LLP; Michael J. Musella, Esq.

(57) ABSTRACT

A pixel circuit, a display panel and a driving method thereof are disclosed. The pixel circuit includes a light-emitting element, a light-emitting control circuit, a touch detection circuit and a signal line. The light-emitting control circuit is electrically connected to the light-emitting element, and is configured to drive the light-emitting element to emit light; the touch detection circuit is configured to determine whether or not a touch action occurs based on intensity of light incident onto the touch detection circuit; and the signal line is configured to be electrically connected to an input terminal of the light-emitting control circuit and an output terminal of the touch detection circuit.

13 Claims, 6 Drawing Sheets

(51) Int. Cl.
  *G09G 3/3225* (2016.01)
  *G09G 3/3275* (2016.01)
  *H01L 27/32* (2006.01)
  *G06F 3/044* (2006.01)
  *G09G 3/3208* (2016.01)

(52) U.S. Cl.
  CPC ...... *G06F 3/04164* (2019.05); *G06F 3/04166* (2019.05); *G09G 3/3208* (2013.01); *G09G 3/3225* (2013.01); *G09G 3/3275* (2013.01); *H01L 27/323* (2013.01); *G09G 2300/0852* (2013.01)

(56) References Cited

U.S. PATENT DOCUMENTS

| | | |
|---|---|---|
| 2015/0002414 A1 | 1/2015 | Tan et al. |
| 2015/0205429 A1 | 7/2015 | Nie et al. |
| 2016/0274719 A1 | 9/2016 | Yang et al. |
| 2017/0177154 A1 | 6/2017 | Choo et al. |
| 2018/0246614 A1 | 8/2018 | Hu |

FOREIGN PATENT DOCUMENTS

| | | |
|---|---|---|
| CN | 102830859 A | 12/2012 |
| CN | 103218085 A | 7/2013 |
| CN | 103353814 A | 10/2013 |
| CN | 103554079 A | 10/2013 |
| CN | 103870068 A | 6/2014 |
| CN | 104217677 A | 12/2014 |
| CN | 104392699 A | 3/2015 |
| CN | 105423911 A | 3/2016 |
| CN | 105988649 A | 10/2016 |
| CN | 106952612 A | 7/2017 |
| JP | 2012123399 A | 6/2012 |
| KR | 1020100006022 A | 1/2010 |
| TW | I253846 B | 4/2006 |
| WO | 2017052727 A1 | 3/2017 |

OTHER PUBLICATIONS

International Search Report and Written Opinion dated May 22, 2018 from State Intellectual Property Office of the P.R. China.
First Chinese Office Action dated Oct. 9, 2018.

PIXEL CIRCUIT, DISPLAY PANEL AND DRIVING METHOD THEREOF

The application claims priority to Chinese patent application No. 201710364526.1, filed on May 22, 2017, the entire disclosure of which is incorporated herein by reference as part of the present application.

TECHNICAL FIELD

Embodiments of the present disclosure relate to a pixel circuit, a display panel and a driving method thereof.

BACKGROUND

Organic light emitting diode (OLED) display panels have gradually attracted the attention of people due to characteristics such as wide viewing angle, high contrast, fast response, and advantages such as higher luminance, lower driving voltage and the like over inorganic light emitting diode display devices. Because of the above-mentioned characteristics and advantages, organic light emitting diode (OLED) display panels can be applied into devices with display functions such as mobile phones, displays, laptops, digital cameras, instruments, and the like.

SUMMARY

At least one embodiment of the present disclosure provides a pixel circuit. The pixel circuit comprises a light-emitting element, a light-emitting control circuit, a touch detection circuit and a signal line. The light-emitting control circuit is electrically connected to the light-emitting element, and is configured to drive the light-emitting element to emit light; the touch detection circuit is configured to determine whether or not a touch action occurs based on intensity of light incident onto the touch detection circuit; and the signal line is configured to be electrically connected to an input terminal of the light-emitting control circuit and an output terminal of the touch detection circuit.

For example, in the pixel circuit provided by at least one embodiment of the present disclosure, the touch detection circuit comprises a sensing element and the sensing element is configured to convert light incident onto the sensing element into a sensed electrical signal.

For example, in the pixel circuit provided by at least one embodiment of the present disclosure, the touch detection circuit further comprises an amplification circuit and the amplification circuit is configured to amplify the sensed electrical signal outputted by the sensing element, so as to improve signal-to-noise ratio of a touch electrical signal outputted by the touch detection circuit.

For example, in the pixel circuit provided by at least one embodiment of the present disclosure, the touch detection circuit comprises a first transistor, a second transistor, a third transistor, a first capacitor and a first node; the first transistor serves as the sensing element, and a second terminal of the first transistor is electrically connected to the first node; the amplification circuit comprises the second transistor and the first capacitor; a control terminal of the second transistor is electrically connected to the first node, a first terminal of the second transistor is electrically connected to a first terminal of the third transistor, a second terminal of the second transistor is electrically connected to a second terminal of the first capacitor; a first terminal of the first capacitor is electrically connected to the first node; and a second terminal of the third transistor is electrically connected to the signal line.

For example, in the pixel circuit provided by at least one embodiment of the present disclosure, the light-emitting control circuit comprises a light-emitting driving circuit, a light-emitting select circuit and a second capacitor. The light-emitting driving circuit is configured to be able to drive the light-emitting element to emit light; the light-emitting select circuit is configured to be able to write a data signal into a control terminal of the light-emitting driving circuit selectively; and the second capacitor is configured to store the data signal and to keep the data signal at the control terminal of the light-emitting driving circuit.

For example, in the pixel circuit provided by at least one embodiment of the present disclosure, the light-emitting control circuit further comprises a second node; the light-emitting driving circuit comprises a fourth transistor, a control terminal of the fourth transistor is electrically connected to the second node, a first terminal of the fourth transistor is electrically connected to a second terminal of the light-emitting element, a second terminal of the fourth transistor is configured to be electrically connected to a first power source terminal; the light-emitting select circuit comprises a fifth transistor, a first terminal of the fifth transistor is electrically connected to a first terminal of the signal line, a second terminal of the fifth transistor is electrically connected to the second node; a first terminal of the second capacitor is electrically connected to the second node, a second terminal of the second capacitor is electrically connected to the second terminal of the fourth transistor; and a first terminal of the light-emitting element is electrically connected to a second power source terminal.

For example, in the pixel circuit provided by at least one embodiment of the present disclosure, the touch detection circuit comprises a first transistor, the light-emitting control circuit comprises a fourth transistor; and the first transistor is a bottom-gate transistor, the fourth transistor is a top-gate transistor, and an active layer of the first transistor and an active layer of the fourth transistor are formed in same one layer.

At least one embodiment of the present disclosure provides a display panel, and the display panel comprises: a plurality of pixel units, which are arrayed, and a write-read-select circuit. At least one of the pixel units comprises the above-mentioned pixel circuit. The write-read-select circuit comprises a first terminal, a second terminal and a third terminal, the third terminal is electrically connected to the signal line of the pixel circuit, the first terminal is able to be electrically connected to a data driving circuit, the second terminal is able to be electrically connected to a touch driving circuit; and the write-read-select circuit is configured to be able to connect the first terminal to the third terminal or to connect the second terminal to the third terminal.

For example, in the display panel provided by at least one embodiment of the present disclosure, the write-read-select circuit is configured to: electrically connect the first terminal to the third terminal in a display stage, so as to input a display data signal into the light-emitting control circuit of the pixel circuit through the signal line of the pixel circuit; and electrically connect the second terminal to the third terminal in a light-sensed-value reading stage, so as to read a touch electrical signal outputted by the touch detection circuit of the pixel circuit through the signal line of the pixel circuit.

For example, in the display panel provided by at least one embodiment of the present disclosure, the write-read-select circuit comprises a first control transistor and a second control transistor; a first terminal of the first control transistor is electrically connected to the signal line of the pixel circuit and a second terminal of the first control transistor is configured to be able to be electrically connected to the data driving circuit; and a first terminal of the second control transistor is electrically connected to the signal line of the pixel circuit and a second terminal of the second control transistor is configured to be able to be electrically connected to the touch driving circuit.

For example, the display panel provided by at least one embodiment of the present disclosure further comprises the touch driving circuit and the data driving circuit, in which the second terminal of the first control transistor is electrically connected to the data driving circuit; and the second terminal of the second control transistor is electrically connected to the touch driving circuit.

For example, the display panel provided by at least one embodiment of the present disclosure further comprises a voltage select circuit, in which the voltage select circuit is configured to electrically connect an input terminal of the touch detection circuit of the pixel circuit to a first input power source or a second input power source.

For example, in the display panel provided by at least one embodiment of the present disclosure, the voltage select circuit comprises a third control transistor and a fourth control transistor; a first terminal of the third control transistor is electrically connected to the input terminal of the touch detection circuit of the pixel circuit and a second terminal of the third control transistor is configured to be able to be electrically connected to the first input power source; and a first terminal of the fourth control transistor is electrically connected to the input terminal of the touch detection circuit of the pixel circuit and a second terminal of the fourth control transistor is configured to be able to be electrically connected to the second input power source.

For example, in the display panel provided by at least one embodiment of the present disclosure, all pixel units in at least one column each comprise the above-mentioned pixel circuit and share same one signal line.

At least one embodiment of the present disclosure provides a driving method for a display panel. The driving method for the display panel comprises: in a display stage, inputting a display data signal to the light-emitting control circuit of the pixel circuit through the signal line of the pixel circuit, so as to drive the pixel circuit to emit light; and in a light-sensed-value reading stage, reading a touch electrical signal outputted by the touch detection circuit of the pixel circuit through the signal line of the pixel circuit, so as to determine whether or not a touch action occurs.

For example, in the driving method for the display panel provided by at least one embodiment of the present disclosure, the display stage comprises a reset stage and a sensing stage, and the driving method further comprises: in the reset stage, writing a first voltage into an input terminal of the touch detection circuit of the pixel circuit; and in the sensing stage, writing a second voltage into the input terminal of the touch detection circuit of the pixel circuit, in which the second voltage is smaller than the first voltage.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

Figure 1:
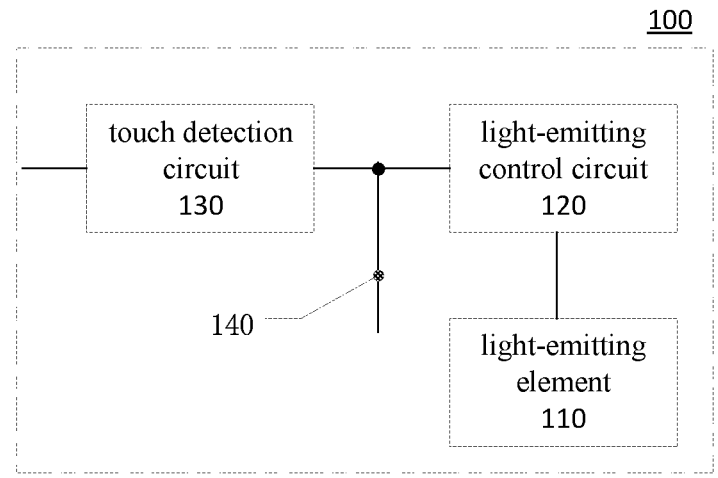
FIG. 1 is a schematic block diagram of a pixel circuit provided by a first embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventor of the present disclosure notes that organic light-emitting diode (OLED) display panels with touch function generally adopt capacitive touch technologies. However, two distinct and independent manufacturing processes (i.e., manufacturing process for capacitive touch substrate and manufacturing process for OLED display substrate) are required for manufacturing OLED display panels based on the capacitive touch technologies, and therefore, the structures and the manufacturing processes of the OLED display panels based on the capacitive touch technologies are complicated.

For example, transistors can be divided into N type transistors and P type transistors according to the characteristics of the transistors; for the sake of clarity, the embodiments of the present disclosure describe the technical solution of the present disclosure in detail by taking the case that the transistors are P type transistors, but the transistors of the embodiments of the present disclosure are not limited to be P type transistors, and those skilled in the art can implement one or more transistors in the embodiments of the present disclosure with N type transistors according actual demands. These transistors, for example, are thin-film-transistors.

Embodiments of the present disclosure provide a pixel circuit, a display panel and a driving method thereof, which realize the display panel with touch function and optimize layout of the pixel circuit and the display panel.

At least one embodiment of the present disclosure provides a pixel circuit. The pixel circuit comprises a light-emitting element, a light-emitting control circuit, a touch detection circuit and a signal line. The light-emitting control circuit is electrically connected to the light-emitting element, and is configured to drive the light-emitting element to emit light; the touch detection circuit is configured to determine whether or not a touch action occurs based on intensity of light incident onto the touch detection circuit; and the signal line is configured to be electrically connected to an input terminal of the light-emitting control circuit and an output terminal of the touch detection circuit.

At least one embodiment of the present disclosure provides a display panel, and the display panel comprises a plurality of pixel units, which are arrayed, and a write-read-select circuit. At least one of the pixel units comprises the above-mentioned pixel circuit. The write-read-select circuit comprises a first terminal, a second terminal and a third terminal, the third terminal is electrically connected to the signal line of the pixel circuit, the first terminal is able to be electrically connected to a data driving circuit, and the second terminal is able to be electrically connected to a touch driving circuit; and the write-read-select circuit is configured to be able to connect the first terminal to the third terminal or to connect the second terminal to the third terminal.

At least one embodiment of the present disclosure provides a driving method for a display panel. The driving method for the display panel comprises: in a display stage, inputting a display data signal to the light-emitting control circuit of the pixel circuit through the signal line of the pixel circuit, so as to drive the pixel circuit to emit light; and in a light-sensed-value reading stage, reading a touch electrical signal outputted by the touch detection circuit of the pixel circuit through the signal line of the pixel circuit, so as to determine whether or not a touch action occurs.

Non-limitive descriptions of the pixel circuit, the display panel and the driving method thereof are below, which are provided by the embodiments of the present disclosure, in the following with reference to a plurality of embodiments. As described in the following, in case of no conflict, different features in these specific embodiments can be combined so as to obtain new embodiments, and the new embodiments are also fall within the scope of the present disclosure.

First Embodiment

Figure 2:
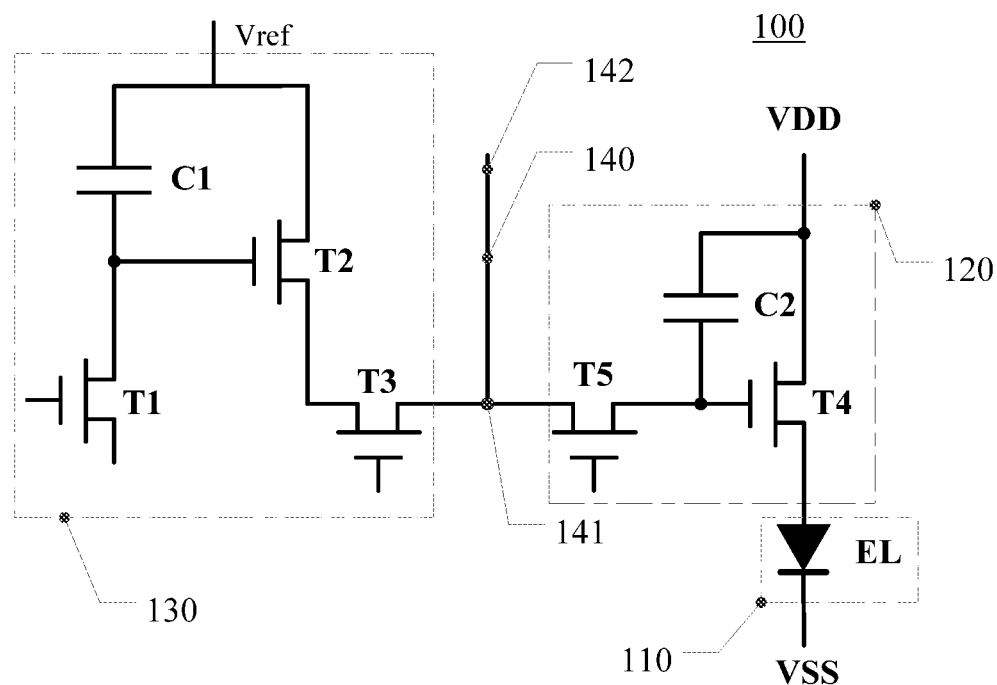
FIG. 2 is an exemplary circuit diagram of the pixel circuit as illustrated in FIG. 1.

The present embodiment provides a pixel circuit 100, and the pixel circuit 100, for example, can be applied in display panels, for example, the pixel circuit 100 can be applied in OLED display panels and the like. For example, FIG. 1 is a schematic block diagram of the pixel circuit 100 provided by the first embodiment of the present disclosure. As illustrated in FIG. 1, the pixel circuit 100 may comprise a light-emitting element 110 (for example, may comprise a light-emitting element EL as illustrated in FIG. 2), a light-emitting control circuit 120, a touch detection circuit 130 and a signal line 140. For example, specific settings of the light-emitting element 110, the light-emitting control circuit 120 and the touch detection circuit 130 may be set according to specific implementation demands, and no specific limitation is given to the embodiments of the present disclosure in this respect. For example, the pixel circuit 100 provided by the first embodiment of the present disclosure may be implemented as the circuit as illustrated in FIG. 2.

For example, as illustrated in FIG. 1 and FIG. 2, the light-emitting element 110 may be an organic light-emitting element, and the organic light-emitting element, for example, may be an organic light-emitting diode, but the embodiments of the present disclosure are not limited to this case. For example, the signal line 140 may comprise a first terminal 141 and a second terminal 142, and the signal line 140 (for example, the first terminal 141 of the signal line) is configured to be electrically connected to an input terminal 163 of the light-emitting control circuit 120 and an output terminal 162 of the touch detection circuit 130 (refer to FIG. 3, FIG. 4A, and FIG. 4B), and therefore, at different time periods, a display data signal can be inputted into the light-emitting control circuit 120 through the signal line 140 of the pixel circuit 100 or a touch electrical signal, outputted by the touch detection circuit 130 of the pixel circuit 100, can be read (accessed) through the signal line 140 of the pixel circuit 100, and thus layout of the pixel circuit 100 can be optimized, cost of the pixel circuit 100 can be reduced, and power consumption for operating products comprising the pixel circuit 100 can be decreased.

Figure 3:
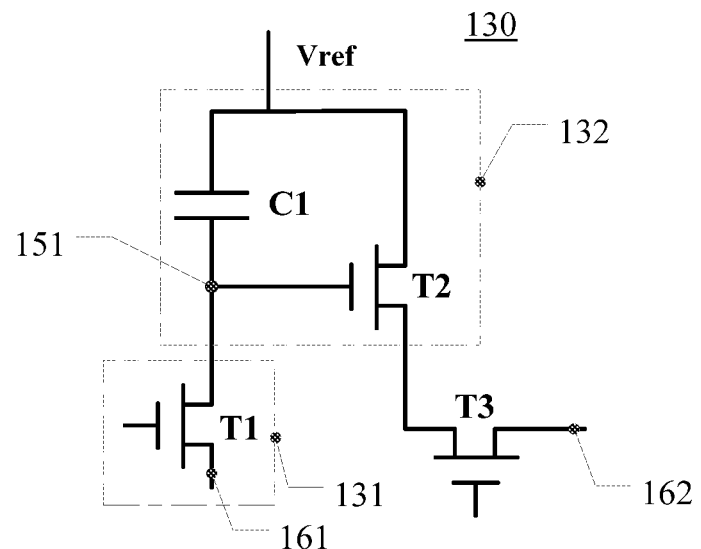
FIG. 3 is an exemplary circuit diagram of a touch detection circuit of the pixel circuit as illustrated in FIG. 1.

For example, the touch detection circuit 130 provided by the embodiments of the present disclosure is described in detail in the following with reference to FIG. 1-FIG. 3.

For example, as illustrated in FIG. 1 and FIG. 2, the touch detection circuit 130 may be configured to sense the intensity of light incident onto the touch detection circuit 130, and to determine whether or not a touch action occurs by using the signal generated by the touch detection circuit 130. For example, the touch detection circuit 130 may be configured to determine whether or not a touch action occurs through sensing the intensity of light, which is emitted by the light-emitting element EL and reflected (for example, reflected by a finger to perform touch operation or by a touch pen) onto the touch detection circuit 130. For another example, the touch detection circuit 130 may also be configured to determine whether or not a touch action occurs through sensing the intensity of the ambient light incident onto the touch detection circuit 130. For example, the embodiments of the present disclosure describe the technical solutions of the present disclosure in detail by taking the case that the touch detection circuit 130 is configured to determine whether or not a touch action occurs through sensing the intensity of the light, which is emitted by the light-emitting element EL and reflected onto the touch detection circuit 130, but the embodiments of the present disclosure are not limited to this case.

For example, specific settings of the touch detection circuit 130 may be set according to specific implementation demands, and no specific limitation is given to the embodiments of the present disclosure in this respect. For example, as illustrated in FIG. 3, the touch detection circuit 130 may comprise a sensing element 131, and the sensing element 131 may be configured to convert the light incident onto the sensing element 131 into a sensed electrical signal. For example, the sensing element 131 may comprise a first transistor T1, and the first transistor T1, for example, may be a bottom-gate transistor. Because the upper side of the channel region of the first transistor T1 is not obscured, the first transistor T1 can sense the light incident onto the first transistor T1, and the light incident onto the first transistor T1 can change the off-state leakage current of the first transistor T1.

For example, the first transistor T1 may comprise a first terminal, a second terminal and a control terminal. For example, the first terminal of the first transistor T1 may be implemented as the input terminal 161 of the touch detection circuit 130. For example, in the case that the control terminal of the first transistor T1 receives a turn-on signal (for example, a signal with low voltage level), the first terminal and the second terminal can be connected to each other; and in the case that the control terminal of the first transistor T1 receives a turn-off signal (for example, a signal with high voltage level), the first terminal and the second terminal can be disconnected from each other. However, in the case that a voltage difference occurs between the first terminal of the first transistor T1 and the second terminal of the first transistor T1, leakage current may be generated in the first transistor T1, even when the control terminal of the first transistor T1 receives a turn-off signal, and the intensity of the leakage current can be increased along with an increase of the intensity of light incident onto the first transistor T1, such that whether or not a touch action occurs can be determined according to the intensity of the leakage current generated in the first transistor T1.

For example, in the case that the touch detection circuit 130 is configured to determine whether or not a touch action occurs through sensing the intensity of light, which is emitted by the light-emitting element EL and reflected onto the touch detection circuit 130, when there is a touch action, because shielding of, for example, a finger, the light emitted by the light-emitting element EL is reflected by the finger and incident onto the first transistor T1, and therefore the intensity of the light sensed by the first transistor T1 is increased, and the sensed electrical signal (for example, a current signal) converted by the first transistor T1 is increased accordingly. Therefore, in this case, it can be determined that a touch operation occurs in the position corresponding to the pixel circuit 100 in the case that the intensity of the sensed electrical signal outputted by the first transistor T1 is larger than a pre-determined value; and it can be determined that no touch operation occurs in the position corresponding to the pixel circuit 100 in the case that the intensity of the sensed electrical signal outputted by the first transistor T1 is smaller than or equal to the pre-determined value; and thus the display panel comprising the pixel circuit 100 can achieve the touch function.

For example, the touch detection circuit 130 may further comprise an amplification circuit 132, and the amplification circuit 132 may be configured to amplify the sensed electrical signal outputted by the sensing element 131, so as to increase the signal-to-noise ratio of the touch electrical signal outputted by the touch detection circuit 130. For example, a light-sensing circuit may further comprise a touch select circuit, and the touch select circuit may be configured to control the time for reading the touch electrical signal. For example, specific settings of the touch detection circuit 130 and the touch select circuit may be set according to specific implementation demands, and no specific limitation is given to the embodiments of the present disclosure in this respect. For example, the amplification circuit 132 may comprise a second transistor T2 and a first capacitor C1; for example, the touch select circuit may comprise a third transistor T3; and for example, the second transistor T2 and the third transistor T3 may be implemented as top-gate transistors, and may also be implemented as bottom-gate transistors.

For example, the touch detection circuit 130 may further comprise a first node 151. For example, the second terminal of the first transistor T1 may be electrically connected to the first node 151. For example, a control terminal of the second transistor T2 may be electrically connected to the first node 151, a first terminal of the second transistor T2 may be electrically connected to a first terminal of the third transistor T3, and a second terminal of the second transistor T2 may be electrically connected to a second terminal of the first capacitor C1 and is electrically connected to a reference voltage terminal Vref. For example, a first terminal of the first capacitor C1 may be electrically connected to the first node 151, the second terminal of the first capacitor C1 is electrically connected to the reference voltage terminal Vref; and a second terminal of the third transistor T3 may be electrically connected to the signal line 140 (for example, the first terminal 141 of the signal line).

For example, in the case that the touch detection circuit 130 comprises the first capacitor C1, the second transistor T2 and the third transistor T3, the touch detection circuit 130 may achieve touch detection function with the following steps.

In step S110: enabling the first transistor T1 to be in a turn-on state and writing a first voltage (a reset voltage) into the first node 151, through the first terminal of the first transistor T1, in a reset stage.

In step S120: enabling the first transistor T1 to be in a turn-off state and writing a second voltage into the first terminal of the first transistor T1, in a sensing stage; in which the second voltage is smaller than the first voltage.

In step S130: enabling the third transistor T3 to be in a turn-on state and reading the electrical signal outputted by the third transistor T3, through the signal line 140, in a touch electrical signal reading stage.

For example, in the step S110, a signal with low voltage level may be applied to the control terminal of the first transistor T1, so as to enable the first transistor T1 to be in a turn-on state, and thus the first voltage can be written into the first node 151 through the first transistor T1 in a turn-on state. For example, the first voltage written into the first node 151 may be stored in the first capacitor C1 and the first capacitor C1 may keep the first voltage, which is written into the first node 151, at the control terminal of the second transistor T2. In this case, the first voltage, which is written into the first node 151, enables the second transistor T2 to be in a turn-off state. For example, the voltage of the control terminal of the second transistor T2 and the voltage of the second terminal of the second transistor T2 may be identical, that is, in this case, the first voltage is equal to the reference voltage Vref. In the following, the embodiments of the present disclosure is described by taking the case that the first voltage is equal to the reference voltage, but embodiments of the present disclosure is not limited in this case. For example, a signal with high voltage level may be applied to the control terminal of the third transistor T3, so as to enable the third transistor T3 to be in a turn-off state.

For example, in the step S120, a signal with high voltage level may be applied to the control terminal of the first transistor T1 and the control terminal of the third transistor T3, so as to enable both the first transistor T1 and the third transistor T3 to be in turn-off states. For example, in the case that a touch action occurs, the light emitted by the light-emitting element EL is reflected by, for example, a finger, and incident onto the first transistor T1, and therefore both the light intensity sensed by the first transistor T1 and the intensity of the leakage current generated in the first transistor T1 are increased, the charge loss at the first terminal of the first capacitor C1 is increased, and the voltage decrement of the first node 151 is increased until the state of the second transistor T2 is changed from turn-off state to turn-on state. It should be noted that, no on-state current occurs in the second transistor T2 even when a touch action occurs and the second transistor T2 is turned on, which is because the third transistor T3 is in a turn-off state.

For example, in the step S130, a signal with low voltage level may be applied to the control terminal of the third transistor T3, so as to enable the third transistor T3 to be in a turn-on state. In this case, the second transistor T2 is in a turn-on state, and the current is flow from the reference voltage terminal Vref to the signal line 140 via the second transistor T2 and the third transistor T3, such that the signal line 140 can read the touch electrical signal outputted by the touch detection circuit 130. For example, the touch electrical signal reading stage further comprises a second sensing stage, and the second sensing stage is a time period, which is a period before the time that the third transistor T3 is turned on, of the touch electrical signal reading stage. For example, the intensity of the touch electrical signal depends on the voltage of the control terminal of the second transistor T2 (i.e., the voltage of the first node 151), while the voltage of the control terminal of the second transistor T2 depends on the value (the integral value) of the leakage current, which is accumulated in the sensing stage and the second sensing stage, in the first transistor T1, that is, the voltage of the control terminal of the second transistor T2 depends on the intensity of light incident onto the first transistor T1. For example, compared with the case that no touch action occurs, in the case that a touch action occurs, the voltage of the first node 151 is lower in the case that a touch action occurs, and therefore the intensity of on-state current in the second transistor T2 and the intensity of the touch electrical signal obtained by the signal line 140 is higher in the touch electrical signal reading stage. In this case, it can be determined that a touch operation occurs in the position corresponding to the pixel circuit 100 in the case that the intensity of the touch electrical signal obtained by the signal line 140 is larger than a pre-determined value. For example, the pre-determined value may be obtained through experiment.

For example, a weak off-state leakage current outputted by the first transistor T1 can be converted into a relative strong on-state current outputted by the second transistor T2, by providing the second transistor T2 and a second capacitor 123 (for example, a second capacitor C2), such that the signal-to-noise ratio of the touch electrical signal outputted by the touch detection circuit 130 can be increased. For example, the sensing stage and the touch electrical signal reading stage can be separated from each other through providing the third transistor T3, in this way, the sensing stage can be still within the display stage even in the case that the touch detection circuit 130 and the light-emitting control circuit 120 share same one signal line 140, and therefore, the intensity and the signal-to-noise ratio of the touch electrical signal can be guaranteed in the case that the time length of the touch electrical signal reading stage is minimized, that is, the pixel circuit 100 provided by the first embodiment of the present disclosure can guarantee or can increase the signal-to-noise ratio of the touch electrical signal while the layout of the circuit is optimized.

For example, the light-emitting control circuit 120 provided by the embodiments of the present disclosure is described in detail in the following with reference to FIG. 1, FIG. 2, FIG. 4A and FIG. 4B. For example, as illustrated in FIG. 1 and FIG. 2, the light-emitting control circuit 120 may be electrically connected to the light-emitting element EL and may be configured to drive the light-emitting element EL to emit light.

For example, the light-emitting control circuit 120 may comprise a light-emitting driving circuit 121, a light-emitting select circuit 122 and a second capacitor 123. For example, the light-emitting driving circuit 121 may be configured to be able to drive the light-emitting element EL to emit light; the light-emitting select circuit 122 may be configured to write data signals into a control terminal of the light-emitting driving circuit 121 selectively; and the second capacitor 123 (for example, the second capacitor C2) may be configured to store the data signals and to keep the data signals at the control terminal of the light-emitting driving circuit 121. For example, specific settings of the light-emitting driving circuit 121, the light-emitting select circuit 122 and the second capacitor 123 may be set according to specific implementation demands, and no specific limitation is given to the embodiments of the present disclosure in this respect.

For example, the light-emitting control circuit 120 may be implemented as a 2T1C circuit, which drives the light-emitting element EL (for example, OLED) to emit light with two thin-film transistors (TFTs) and one storage capacitor. For example, FIG. 4A and FIG. 4B respectively illustrates schematic diagrams of two types of 2T1C pixel circuit.

Figure 4A:
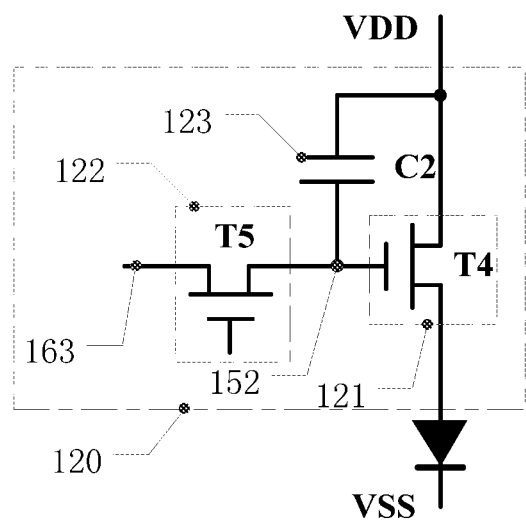
FIG. 4A is an exemplary circuit diagram of a light-emitting control circuit of the pixel circuit as illustrated in FIG. 1.

For example, as illustrated in FIG. 4A, a light-emitting control circuit 120 of 2T1C type may comprise a fifth transistor T5 (i.e., the light-emitting select circuit 122), a fourth transistor T4 (i.e., the light-emitting driving circuit 121) and the second capacitor C2. For example, a control terminal of the fifth transistor T5 may receive scan signals, a first terminal of the fifth transistor T5 may be electrically connected to the signal line 140, so as to receive the data signals, a second terminal of the fifth transistor T5 may be electrically connected to a second node 152, that is, a control terminal of the fourth transistor T4. For example, a first terminal of the fourth transistor T4 may be electrically connected to a second terminal of the light-emitting element EL (for example, the anode of the OLED); and a second terminal of the fourth transistor T4 may be electrically connected to a first power source terminal VDD. For example, the first power source terminal VDD may be a voltage source, so as to output positive voltages with constant value, or, the first power source terminal VDD may also be a current source. For example, a first terminal of the second capacitor C2 is electrically connected to the second node 152 (i.e., the second terminal of the fifth transistor T5 and the control terminal of the fourth transistor T4), and a second terminal of the second capacitor C2 is electrically connected to the second terminal of the fourth transistor T4 and the first power source terminal VDD; and a first terminal of the light-emitting element EL (for example, the cathode of the OLED) is electrically connected to a second power source terminal VSS, for example, the second power source terminal VSS may be a grounded terminal. For example, the 2T1C pixel circuit adopts the second capacitor C2 and two TFTs to control gray scales of the pixel. In a case that the scan signal is applied through a gate line to turn on the fifth transistor T5, a data voltage (provided by a data driving circuit), which is sent through a data line, charges the second capacitor C2 through the fifth transistor T5, such that the data voltage is stored in the second capacitor C2, and the data voltage stored in the second capacitor C2 may control the conducting degree of the fourth transistor T4, so as to control the value of the current, which is flowing through the fourth transistor T4 and used for driving the OLED to emit light, that is, the above-mentioned current determines the gray scale of the emitted light of the pixel.

Figure 4B:
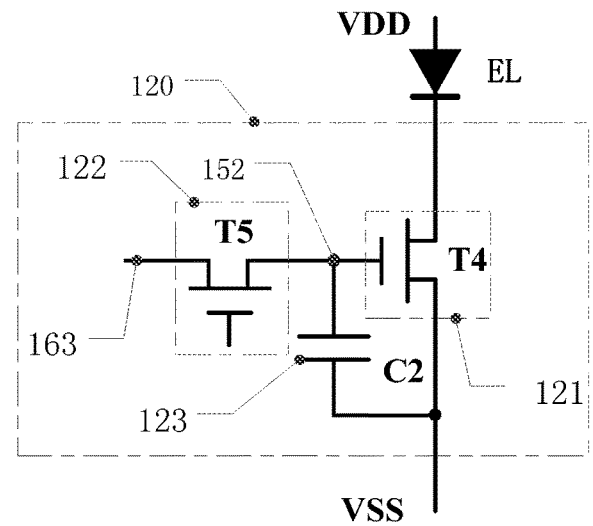
FIG. 4B is another exemplary circuit diagram of a light-emitting control circuit of the pixel circuit as illustrated in FIG. 1.

For example, as illustrated in FIG. 4B, another light-emitting control circuit 120 of 2T1C type also comprises the fifth transistor T5, the fourth transistor T4 and the second capacitor C2, but the connections are changed accordingly. For example, compared with the light-emitting control circuit 120 as illustrated in FIG. 4A, the light-emitting control circuit 120 as illustrated in FIG. 4B comprises the following differences: the second terminal of the light-emitting element EL (for example, the anode of the OLED) is electrically connected to the first power source terminal VDD, while the first terminal of the light-emitting element EL (for example, the cathode of the OLED) is electrically connected to the second terminal of the fourth transistor T4, and the first terminal of the fourth transistor T4 is electrically connected to the second power source terminal VSS. The second terminal of the second capacitor C2 is connected to the second node 152 (i.e., the second terminal of the fifth transistor T5 and the control terminal of the fourth transistor T4), and the first terminal of the second capacitor C2 is connected to the first terminal of the fourth transistor T4 and the second power source terminal VSS. The operation mode of the above-mentioned light-emitting control circuit 120 of 2T1C type is similar to the operation mode of the pixel circuit 120 as illustrated in FIG. 4A and no further descriptions will be given here.

For example, the embodiments of the present disclosure is described by taking the only case that the light-emitting control circuit 120 is a 2T1C type circuit, but the light-emitting control circuit 120 provided by the embodiments of the present disclosure is not limited to be the 2T1C type circuit. For example, according to specific implementation demands, the light-emitting control circuit 120 may also have electrical compensation function, so as to increase the display uniformity of the display panel comprising the pixel circuit 100. For example, the electrical compensation function may be realized by voltage compensation, current compensation or hybrid compensation. The light-emitting control circuit 120 with compensation function, for example, may be a 4T1C type light-emitting control circuit, a 4T2C type light-emitting control circuit, a 6T1C type light-emitting control circuit, and other light-emitting control circuits with electrical compensation function, and no further descriptions will be given here. For another example, the light-emitting control circuit 120 may further comprise an external compensation circuit, for example, may comprise a sensing circuit, so as to sense the electrical characteristics of the driving transistor or the electrical characteristics of the light-emitting element, concrete structures may refer to conventional designs, and no further descriptions will be given here.

It should be understood that the transistors adopted in the first embodiment and other embodiments of the present disclosure may be thin film transistors, field-effect transistors or other switching devices with similar characteristics. A source electrode and a drain electrode of the adopted transistor can be symmetrical in structure, and therefore, there is no difference in the structures of the source electrode and the drain electrode of the transistor. In the embodiments of the present disclosure, in order to distinguish two electrodes of the transistors other than a gate electrode, which serves as a control terminal, one electrode of the two electrodes is denoted as a first terminal, and the other electrode of the two electrodes is denoted as a second terminal, and therefore, the first terminal and the second terminal of all of or part of the transistors in the embodiments of the present disclosure can be interchangeable when required. For example, the first terminal of the transistor in the embodiments of the present disclosure may be a source electrode, and the second terminal of the transistor may be a drain electrode; alternatively, the first terminal of the transistor may be a drain electrode, and the second terminal of the transistor may be a source electrode.

For example, in the present embodiment, the display panel comprising the pixel circuit 100 can have the touch function through providing the touch detection circuit 130 in the pixel circuit 100; the light-emitting control circuit 120 and the touch detection circuit 130 can share same one signal line 140 through connecting the signal line 140 to the input terminal of the light-emitting control circuit 120 and the output terminal of the touch detection circuit 130, such that the layout of the pixel circuit 100 can be optimized. In the present embodiment, the signal-to-noise ratio of the touch electrical signal outputted by the touch detection circuit 130 can be increased through providing an amplification module in the touch detection circuit 130; by providing the touch select circuit in the touch detection circuit 130, the signal-to-noise ratio of the touch electrical signal can be guaranteed or can be increased in the case that the layout of the circuit is optimized.

Second Embodiment

Figure 5:
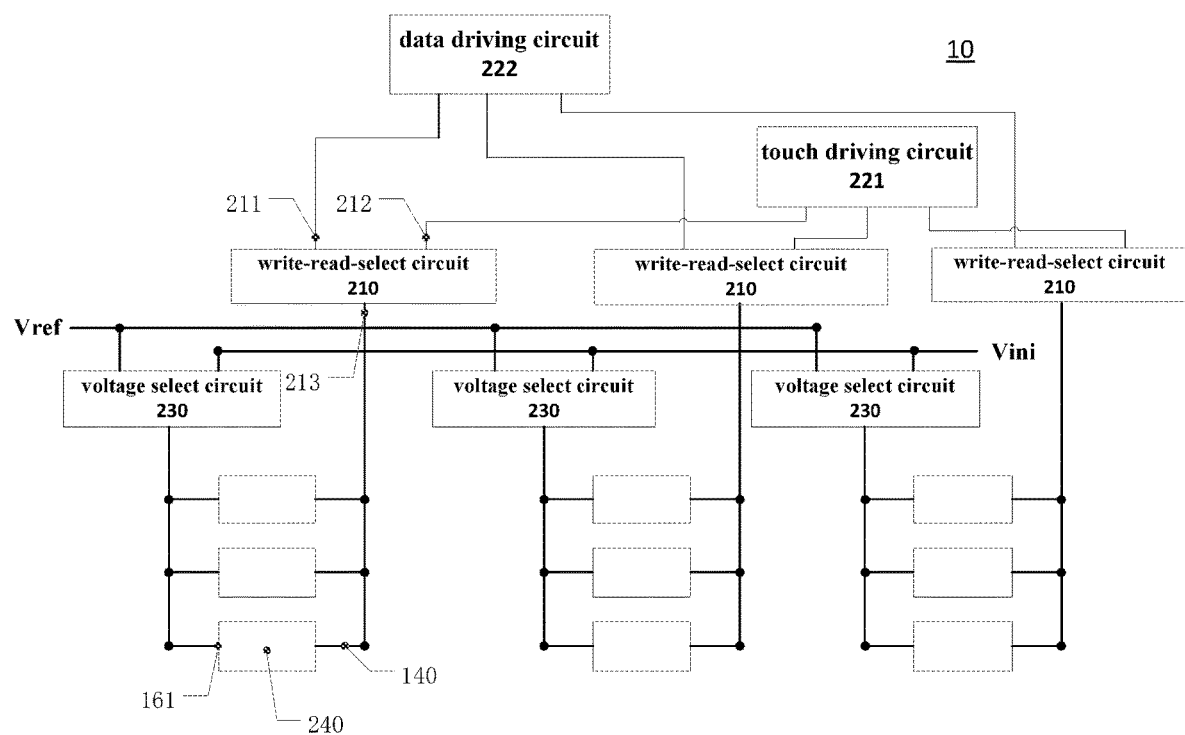
FIG. 5 is a schematic diagram of a display panel provided by a second embodiment of the present disclosure.

The present embodiment provides a display panel 10. For example, as illustrated in FIG. 5, the display panel 10 comprises pixel units 240, which are arrayed, and a write-read-select circuit 210. For example, for the sake of clarity, FIG. 5 only illustrates pixel units 240 located in three rows and three columns, but the embodiments of the present disclosure are not limited to this case. For example, according to specific implementation demands, the display panel 10 may comprise pixel units 240 provided in 1440 rows and 900 columns. For example, at least one pixel unit 240 may comprise any one of the pixel circuits provided by the first embodiment. For example, according to specific implementation demands, part of pixel units of the display panel 10 may comprise the pixel circuit provided by the first embodiment. For example, according the required touch accuracy, one of every ten pixel units may comprise the pixel circuit provided by the first embodiment; or in order to realize pixel-level touch accuracy, all the pixel units 240 in the display panel 10 may comprise the pixel circuit provided by the first embodiment. For another example, the pixel units 240 provided in at least one column of the display panel 10 each may comprise the pixel circuit provided by the first embodiment, and the pixel units 240 provided in every column of the at least one column share same one signal line.

For example, the write-read-select circuit 210 provided by the second embodiment of the present disclosure is described in detail in the following with reference to FIG. 5 and FIG. 6. For example, as illustrated in FIG. 5 and FIG.

6, the write-read-select circuit 210 may comprise a first terminal 211, a second terminal 212 and a third terminal 213, the third terminal 213 is electrically connected to the signal line 140 of the pixel circuit, the first terminal 211 may be electrically connected to a data driving circuit 222, and the second terminal 212 may be electrically connected to a touch driving circuit 221. For example, the write-read-select circuit 210 is configured to electrically connect the first terminal 211 to the third terminal 213 or to electrically connect the second terminal 212 to the third terminal 213, so as to perform corresponding signal transmissions. For example, the write-read-select circuit 210 may be configured to electrically connect the first terminal 211 to the third terminal 213 in a display stage, and in this case, the display data signal can be inputted into the light-emitting control circuit of the pixel circuit through the signal line 140 of the pixel circuit; the write-read-select circuit 210 may be further configured to electrically connect the second terminal 212 to the third terminal 213 in a light-sensed-value reading stage, and in this case, the touch electrical signal outputted by the touch detection circuit of the pixel circuit can be read (accessed) through the signal line 140 of the pixel circuit.

For example, specific settings of the write-read-select circuit 210 may be set according to specific implementation demands, and no specific limitation is given to the embodiments of the present disclosure in this respect. For example, the write-read-select circuit 210 provided by the second embodiment of the present disclosure can be implemented as the circuit as illustrated in FIG. 6. For example, the write-read-select circuit 210 may comprise a first control transistor CT1 and a second control transistor CT2; a first terminal of the first control transistor CT1 (i.e., the third terminal 213 of the write-read-select circuit) is electrically connected to the signal line 140 of the pixel circuit, and a second terminal of the first control transistor CT1 (i.e., the first terminal 211 of the write-read-select circuit) is configured to be able to be electrically connected to the data driving circuit 222; a first terminal of the second control transistor CT2 (i.e., the third terminal 213 of the write-read-select circuit) is electrically connected to the signal line 140 of the pixel circuit, and a second terminal of the second control transistor CT2 (i.e., the second terminal 212 of the write-read-select circuit) is configured to be able to be electrically connected to the touch driving circuit 221.

For example, according to specific implementation demands, the display panel 10 may further comprise the touch driving circuit 221 and the data driving circuit 222, and in this case, the second terminal of the first control transistor CT1 is electrically connected to the data driving circuit 222, and the second terminal of the second control transistor CT2 is electrically connected to the touch driving circuit 221. For example, by controlling the conducting state (in turn-on or turn-off state) of the first control transistor CT1 and the second control transistor CT2, the first terminal 211 of the write-read-select circuit can be electrically connected to the third terminal 213 of the write-read-select circuit, or the second terminal 212 of the write-read-select circuit can be electrically connected to the third terminal 213 of the write-read-select circuit, that is, by controlling the conducting state (in turn-on or turn-off state) of the first control transistor CT1 and the second control transistor CT2, the data driving circuit 222 can be electrically connected to the signal line 140 of the pixel circuit, or the touch driving circuit 221 can be electrically connected to the signal line 140 of the pixel circuit. Therefore, the data driving circuit 222 can input the display data signal into the light-emitting control circuit of the pixel circuit through the signal line 140 of the pixel circuit in the display stage, and the touch driving circuit 221 can read the touch electrical signal outputted by the touch detection circuit of the pixel circuit through the signal line 140 of the pixel circuit in the light-sensed-value reading stage. The light-emitting control circuit and the touch detection circuit of the pixel circuit of the display panel 10 provided by the second embodiment of the present disclosure can share the signal line 140, and the layout of the pixel circuit and the display panel 10 can be optimized. The touch driving circuit 221 and the data driving circuit 222 may be implemented into various types, for example, each of the touch driving circuit 221 and the data driving circuit 222 may be implemented with an individual semiconductor chip, or the touch driving circuit 221 and the data driving circuit 222 may be implemented with same one semiconductor chip, or the touch driving circuit 221 and the data driving circuit 222 may be implemented with FPGA circuit(s).

For example, the display panel 10 may further comprise a voltage select circuit 230. For example, the write-read-select circuit 210 provided by the second embodiment of the present disclosure is described in detail in the following with reference to FIG. 5 and FIG. 6. For example, the voltage select circuit 230 may be configured to electrically connect the input terminal 161 of the touch detection circuit of the pixel circuit (for example, the first terminal of the first transistor) to a first input power source Vref or a second input power source Vini. For example, specific settings of the voltage select circuit 230 may be set according to specific implementation demands, and no specific limitation will be given to the embodiments of the present disclosure in this respect.

Figure 6:
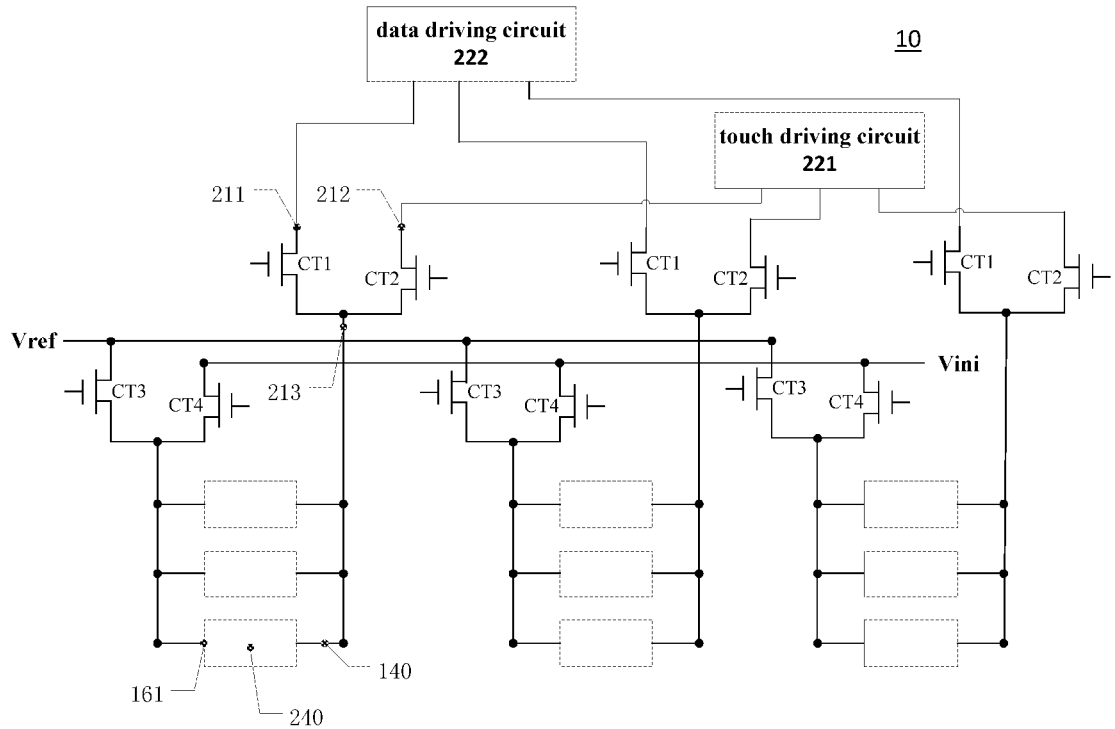
FIG. 6 is an exemplary circuit diagram of the display panel as illustrated in FIG. 5.

For example, the voltage select circuit 230 provided by the second embodiment of the present disclosure can be implemented as the circuit as illustrated in FIG. 6. For example, as illustrated in FIG. 6, the voltage select circuit 230 may comprise a third control transistor CT3 and a fourth control transistor CT4; a first terminal of the third control transistor CT3 is electrically connected to the input terminal 161 of the touch detection circuit of the pixel circuit, and a second terminal of the third control transistor CT3 is configured to be able to be electrically connected to the first input power source Vref; a first terminal of the fourth control transistor CT4 is electrically connected to the input terminal 161 of the touch detection circuit of the pixel circuit, and a second terminal of the fourth control transistor CT4 is configured to be able to be electrically connected to the second input power source Vini. For example, the first input power source Vref and the second input power source Vini may be voltage sources, and the intensity of the first voltage outputted by the first input power source Vref may be larger than the intensity of the second voltage outputted by the second input power source Vini. For example, in the case that the third control transistor CT3 is turned on and the fourth control transistor CT4 is turned off, the first voltage can be written into the input terminal 161 of the touch detection circuit of the pixel circuit (for example, the first terminal of the first transistor); in the case that the third control transistor CT3 is turned off and the fourth control transistor CT4 is turned on, the second voltage can be written into the input terminal 161 of the touch detection circuit of the pixel circuit. For example, the voltage select circuit 230 provided by the second embodiment of the present disclosure can write voltages with two different intensities into the input terminal 161 of the touch detection circuit without the need to provide an AC power supply (for example, a voltage source), such that current manufacturing processes for the display panel can be better utilized and be compatible.

It should be noted that those skilled in the art should understand that other indispensable components (such as a control device, an image data encoding/decoding device, a row scan driver, a column scan driver, a clock circuit or the like) of the display panel 10 may adopt conventional and suitable components, no further descriptions will be given here and it should not be construed as a limitation on the embodiments of the present disclosure.

For example, in the present embodiment, the display panel 10 can achieve the touch function through enabling at least one pixel unit 240 of the display panel 10 to comprise any one of the pixel circuits provided by the first embodiment; by providing the write-read-select circuit 210, the signal line 140 of the pixel circuit can be electrically connected to the data driving circuit 222 or the touch driving circuit 221, so as to enable the data driving circuit 222 to input the display data signal into the light-emitting control circuit of the pixel circuit through the signal line 140 of the pixel circuit, and to enable the touch driving circuit 221 to read the touch electrical signal outputted by the touch detection circuit of the pixel circuit through the signal line 140 of the pixel circuit; by providing the voltage select circuit 230, signals (for example, voltage signals) with two different intensities can be written into the input terminal 161 of the touch detection circuit without the need to provide the AC power supply.

Third Embodiment

Figure 7:
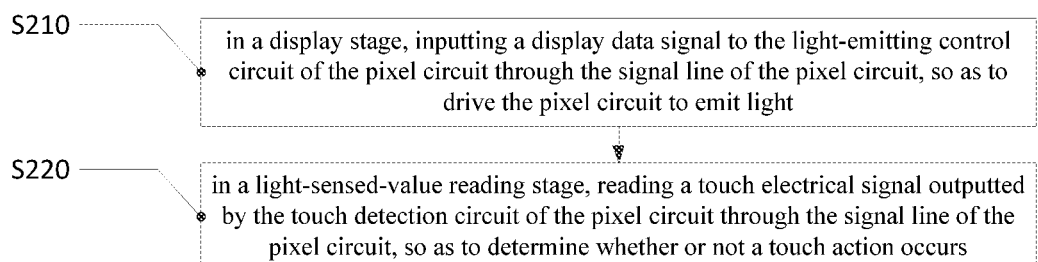
FIG. 7 is an exemplary flow chart of a driving method for a display panel provided by a third embodiment of the present disclosure.

The present embodiment provides a driving method for a display panel. For example, as illustrated in FIG. 7, the driving method for the display panel may comprise the following steps.

In step S210: in a display stage EL, inputting a display data signal to the light-emitting control circuit of the pixel circuit through the signal line of the pixel circuit, so as to drive the pixel circuit to emit light.

In step S220: in a light-sensed-value reading stage R, reading a touch electrical signal outputted by the touch detection circuit of the pixel circuit through the signal line of the pixel circuit, so as to determine whether or not a touch action occurs.

There is no absolute sequence for the above-mentioned steps, and it's not required that every display stage is accompanied with a light-sensed-value reading stage (a touch stage). In the case that time accuracy for touch is satisfied, one light-sensed-value reading stage may be provided for every two or more display stages, so as to reduce power consumption.

Figure 8:
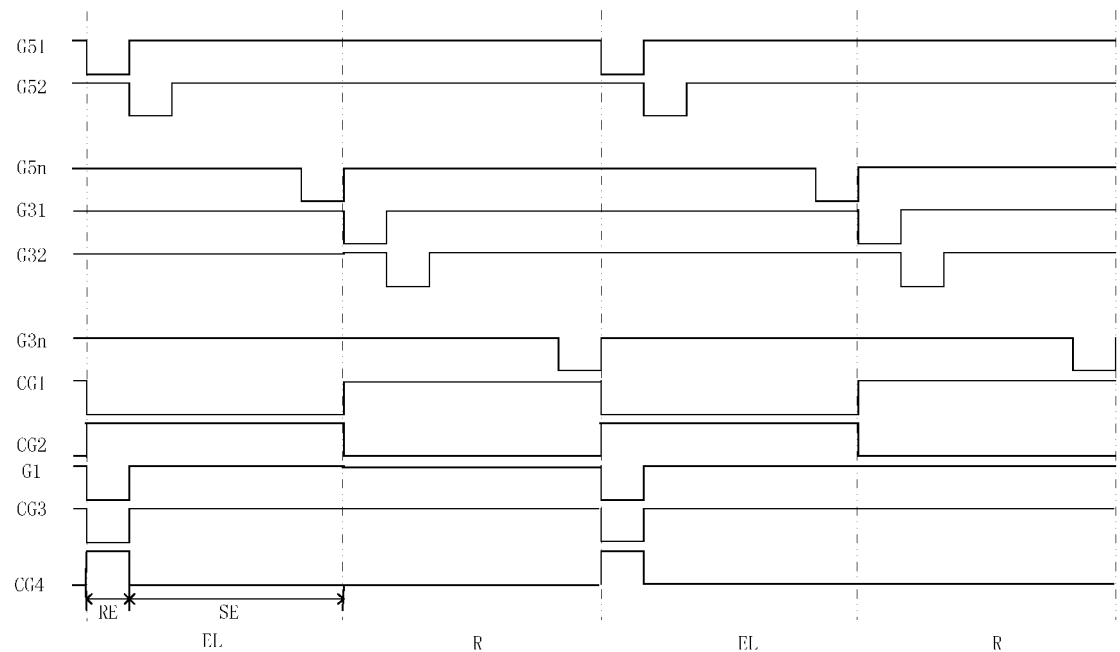
FIG. 8 is an exemplary timing diagram of the driving method as illustrated in FIG. 7.

For example, the timing diagram to drive the display panel may be set according to specific implementation demands, and no specific limitation is given to the embodiments of the present disclosure in this respect. For example, FIG. 8 is an exemplary timing diagram of the driving method as illustrated in FIG. 7. The control terminal of the first transistor T1 as illustrated in FIG. 6 of the second embodiment, the control terminals of the third transistors T3, which are located in the first row to the nth row, the control terminals of the fifth transistors T5, which are located in the first row to the nth row, and the control terminals of the first control transistor—to the fourth control transistor CT1-CT4 are respectively denoted as G1, G31-G3n, G51-G5n and CG1-CG4. For example, for the sake of clarity, in FIG. 8, the time length of the light-sensed-value reading stage R and the time length of the display stage EL are identical, but the embodiments of the present disclosure are not limited to this case. For example, according to specific implementation demands, the time length of the light-sensed-value reading stage R can be equal to a half of the time length of the display stage EL or one-tenth of the time length of the display stage EL.

For example, the display stage EL is described in detail in the following with reference to FIG. 7 and FIG. 8. For example, as illustrated in FIG. 8, in the display stage EL, the control terminal CG1 of the first control transistor CT1 receives a signal with low voltage level, and the control terminal CG2 of the second control transistor CT2 receives a signal with high voltage level; in this case the first control transistor CT1 is turned on and the second control transistor CT2 is turned off, and therefore, the data driving circuit may input the display data signal into the light-emitting control circuit of the pixel circuit through the first control transistor CT1 in a turn-on state and the signal line of the pixel circuit; meanwhile, the control terminals G51-G5n of the fifth transistors T5 (not illustrated in FIG. 7 and FIG. 8, please refer to FIG. 2), which are located in the first row to the nth row, receive signals with low voltage level row by row, so as to enable the pixel units of the display panel to emit light row by row. For example, in the display stage EL, all the control terminals G31-G3n of the third transistors T3 (not illustrated in FIG. 7 and FIG. 8, please refer to FIG. 2), which are located in the first row to the nth row, receive signals with high voltage level, so as to enable all the third transistors T3 to be turned-off.

For example, during the display stage EL, a reset stage RE and a sensing stage SE may be provided for the touch detection circuit, and the driving method for the display panel may further comprise the following steps.

In step S310: in the reset stage RE, writing a first voltage into an input terminal of the touch detection circuit of the pixel circuit.

In step S320: in the sensing stage SE, writing a second voltage into the input terminal of the touch detection circuit of the pixel circuit, wherein the second voltage is smaller than the first voltage.

For example, in the reset stage RE, the control terminal CG3 of the third control transistor CT3 and the control terminal G1 of the first transistor T1 receive signals with low voltage level and the control terminal CG4 of the fourth control transistor CT4 receives a signal with high voltage level; in this case, both the third control transistor CT3 and the first transistor T1 are turned on and the fourth control transistor CT4 is turned off, and therefore the first voltage can be written into the input terminal of the touch detection circuit, and the first voltage is written into the first node of the pixel circuit through the first transistor T1 in a turned-on state, and the first voltage, which is written into the first node, enables the second transistor T2 in the touch detection circuit to be in a turn-off state.

For example, in the sensing stage SE, the control terminal CG3 of the third control transistor CT3 and the control terminal G1 of the first transistor T1 receive signals with high voltage level, and the control terminal CG4 of the fourth control transistor CT4 receives a signal with low voltage level; in this case, both the third control transistor CT3 and the first transistor T1 are turned off and the fourth control transistor CT4 is turned on, and therefore the second voltage can be written into the input terminal of the touch detection circuit. Because the second voltage is smaller than the first voltage, a voltage difference occurs between the first terminal of the first transistor T1 and the second terminal of the first transistor T1, and therefore the intensity of the leakage current in the first transistor T1 is increased along with an increase of the intensity of light incident onto the first transistor T1, and the voltage of the control terminal of the second transistor T2 is decreased along with an increase of the intensity of the light incident onto the first transistor T1.

For example, arrangements of the reset stage RE and the sensing stage SE may be set according to specific implementation demands, and no specific limitation is given to the embodiments of the present disclosure in this respect. For example, as illustrated in FIG. 8, the reset stage RE and the sensing stage SE may be provided in parallel with the display stage EL, the starting time of the reset stage RE and the starting time of the display stage EL may be identical, and the sensing stage SE is a time period, which is later than the reset stage RE, of the display stage EL; in this case, the on-state-time of the sensing stage SE of the pixel circuits in different rows are identical. For another example, according to specific implementation demands, the starting time of the reset stage RE of the pixel circuits in different rows may be different from each other and the starting time of the sensing stage SE of the pixel circuits in different rows may be different from each other; for example, in the display stage EL, the reset stage RE and the sensing stage SE of the touch detection circuit of the pixel circuit may be started row by row.

For example, the light-sensed-value reading stage R is described in detail in the following with reference to FIG. 7 and FIG. 8. For example, as illustrated in FIG. 8, in the light-sensed-value reading stage R, the control terminal CG1 of the first control transistor CT1 receives a signal with high voltage level, and the control terminal CG2 of the second control transistor CT2 receives a signal with low voltage level; in this case, the first control transistor CT1 is turned off and the second control transistor CT2 is turned on, and therefore, the touch driving circuit may read the touch electrical signal outputted by the touch detection circuit of the pixel circuit through the signal line of the pixel circuit and the second control transistor CT2 in a turned-on state; meanwhile, the control terminals G31-G3*n* of the third transistors T3 (not illustrated in FIG. 7 and FIG. 8, please refer to FIG. 2), which are located in the first row to the nth row, receive signals with low voltage level row by row, and the touch driving circuit may read the touch electrical signals of the pixel circuits row by row, and therefore whether or not a touch action occurs and the location of the touch action can be determined.

For example, as illustrated in FIG. 8, in the light-sensed-value reading stage R, all the control terminals G51-G5*n* of the fifth transistors T5 (not illustrated in FIG. 7 and FIG. 8, please refer to FIG. 2), which are located in the first row to the nth row, receive signals with high voltage level, and therefore, the fifth transistors T5 are in a turn-off state, and in this case the display panel emit no light. For example, the control terminal G1 of the first transistor T1 and the control terminal CG3 of the third control transistor CT3 may receive signals with high voltage level, the control terminal CG4 of the fourth control transistor CT4 may receive a signal with low voltage level, and therefore, both the first transistor T1 and the third control transistor CT3 are turned off, and the fourth control transistor CT4 is turned on, and thus the second voltage can be written into the input terminal of the touch detection circuit.

For example, by separating the sensing stage SE and the light-sensed-value reading stage R, the sensing stage SE can be still provided in the display stage EL even in the case that the touch detection circuit and the light-emitting control circuit share same one signal line, and therefore, the intensity and the signal-to-noise ratio of the touch electrical signal can be guaranteed in the case that the time length of the touch electrical signal reading stage is minimized, that is, the driving method provided by the third embodiment of the present disclosure can guarantee or can increase the signal-to-noise ratio of the touch electrical signal when adopting a display panel with optimized circuit layout.

Fourth Embodiment

Figure 9:
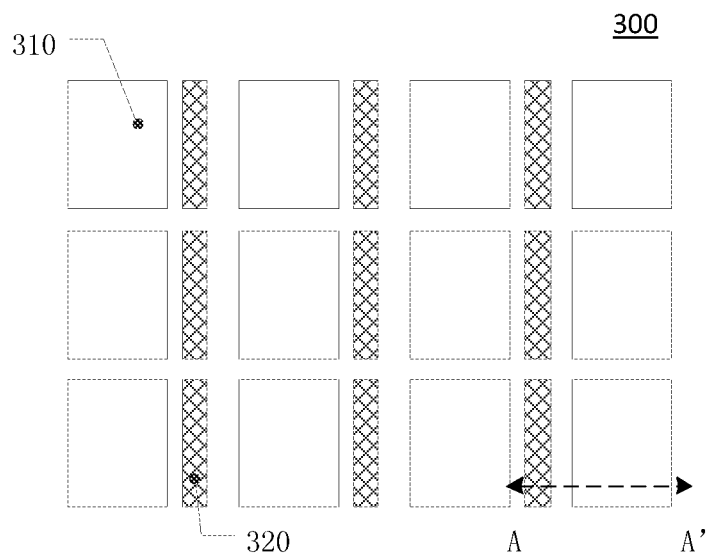
FIG. 9 is an exemplary plan view of a display panel provided by a fourth embodiment of the present disclosure.

The present embodiment provides a display panel 300. For example, specific structures and manufacturing processes of the display panel 300 can be applied to the display panel 10, which is provided by the second embodiment. For example, as illustrated in FIG. 9, the display panel 300 comprises light-emitting regions 310, which are arranged in an array, and light-sensing regions 320 which are arranged in an array. The structure of the display panel 300 is described in detail in the following with reference to FIG. 9 and FIG. 10.

For example, the arrangement of the light-emitting regions 310 and the light-sensing regions 320, the area ratio between the light-emitting regions 310 and the light-sensing regions 320, and the like can be set according to specific implementation demands, and no specific limitation is given to the embodiments of the present disclosure in this respect. For example, as illustrated in FIG. 9, the light-sensing region 320 may be disposed between two light-emitting regions 310, which are adjacent in the row direction, but the embodiments of the present disclosure are not limited to this case. For example, the light-sensing region 320 may also be disposed between two light-emitting regions 310, which are adjacent in the column direction, or may also be disposed among four adjacent light-emitting regions 310.

Figure 10:
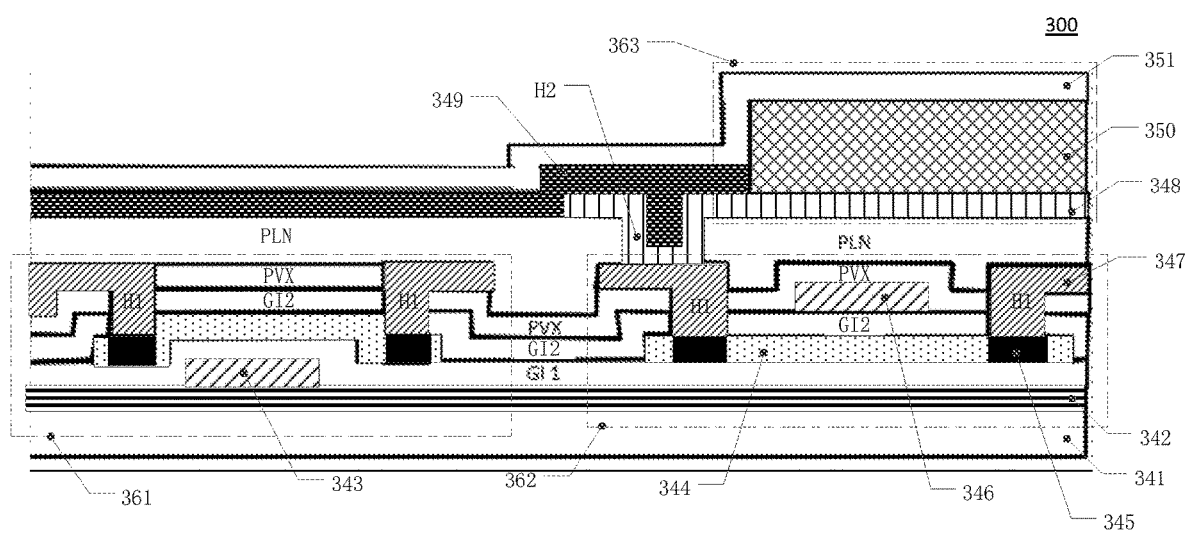
FIG. 10 is a cross-sectional view of the display panel as illustrated in FIG. 9, along line A-A'.

For example, FIG. 10 is a cross-sectional view of a pixel unit of the display panel 300 through line A-A' as illustrated in FIG. 9. For example, as illustrated in FIG. 10, the pixel unit of the display panel 300 may comprise a light-sensing transistor 361 (for example, the first transistor in the first embodiment), a driving transistor 362 (for example, the fourth transistor in the first embodiment) and a light-emitting element 363 (for example, the light-emitting element in the first embodiment). For example, the light-sensing transistor 361 is located in the light-sensing region 320, and the driving transistor 362 and the light-emitting element 363 are located in the light-emitting region 310.

For example, the light-sensing transistor 361 is a bottom-gate transistor, and may comprise a first gate metal layer 343, a first gate insulation layer GI1 a semiconductor layer 344, a passivation layer PVX and a source/drain metal layer 347, which are sequentially disposed. For example, the driving transistor 362 is a top-gate transistor, and may comprise a semiconductor layer 344, a second gate insulation layer GI2, a second gate metal layer 346, a passivation layer PVX and a source/drain metal layer 347, which are sequentially disposed. For example, the semiconductor layer 344 of the light-sensing transistor 361 and the semiconductor layer 344 of the driving transistor 362 can be manufactured in same one manufacturing process, the passivation layer PVX of the light-sensing transistor 361 and the passivation layer PVX of the driving transistor 362 can be manufactured in same one manufacturing process, and the source/drain metal layer 347 of the light-sensing transistor 361 and the source/drain metal layer 347 of the driving transistor 362 can be manufactured in same one manufacturing process, such that the manufacturing processes of the display panel 300 with the touch function can be simplified. For example, the light-emitting element 363 may comprise an anode layer 348, an organic light-emitting layer 350 and a cathode layer 351, which are sequentially disposed. For example, a planarization layer PLN may be disposed between the light-emitting element 363 and the driving transistor 362, and the anode of the light-emitting element 363 may be electrically connected to the source electrode or the drain electrode of the driving transistor 362 through a via hole H2 in the planarization layer PLN.

For example, as illustrated in FIG. 10, the manufacturing processes of the display panel 300 may comprise the following steps.

In step S310: forming the first gate metal layer 343 on a base substrate 341, and forming the gate electrode of the light-sensing transistor 361 through patterning processes (for example, photoresist coating, exposure, development, etching, stripping and the like).

In step S320: forming the first gate insulation layer GI1.

In step S330: forming the semiconductor layer 344 (for example, depositing an amorphous silicon layer, and realizing the crystallization of the amorphous silicon layer through a low temperature crystallization process), and forming the pattern of the active layers of the light-sensing transistor 361 and the driving transistor 362 through a patterning process.

In step S340: forming the second gate insulation layer GI2.

In step S350: forming the second gate metal layer 346, and forming the gate electrode of the driving transistor 362 through a patterning process.

In step S360: forming the passivation layer PVX, and forming a via hole H1 in the passivation layer PVX and the second gate insulation layer GI2 through a patterning process, so as to expose part of the pattern of the active layers of the light-sensing transistor 361 and the driving transistor 362.

In step S370: obtaining n-type doping regions 345 through performing an n-type doping process to the exposed portions of the light-sensing transistor 361 and the driving transistor 362.

In step S380: forming the source/drain metal layer 347, and forming the source electrodes and the drain electrodes of the light-sensing transistor 361 and the driving transistor 362 through a patterning process.

In step S390: forming the planarization layer PLN, and forming the via hole H2 in the planarization layer PLN through a patterning process (for example, through exposure and development processes), so as to expose partial region of the source electrode or the drain electrode of the driving transistor 362.

In step S391: forming the anode layer 348, in which the anode layer 348 is able to be electrically connected to the source electrode or the drain electrode of the driving transistor 362 through the via hole in the planarization layer PLN; for example, the anode layer 348 may only be disposed in the light-emitting regions 310 through a patterning process, so as to enable the light-sensing transistor 361 to sense the intensity of the light incident onto the light-sensing transistor 361.

In step S392: forming a pixel definition layer 349.

In step S393: forming the organic light-emitting layer 350.

In step S394: forming the cathode layer 351 (for example, enabling light to pass through the cathode layer 351).

For example, before performing the step S310, that is, before forming the first gate metal layer 343 on the base substrate 341, a buffer layer 342 may be formed on the base substrate 341, and then the first gate metal layer 343 is formed on the buffer layer 342. For example, specific characteristics and manufacturing methods of the layers and structures of the display panel 300 provided by the present disclosure may refer to manufacturing processes of organic light-emitting devices, and no further descriptions will be given here.

For example, for the sake of clarity, as illustrated in FIG. 10, the display panel 300 only illustrates the light-sensing transistor 361, the driving transistor 362 and the light-emitting element 363. For example, the structures and the manufacturing processes of the switching transistor of the display panel 300 (for example, the second transistor, the third transistor, the fifth transistor in the first embodiment, and the first control transistor to the fourth control transistor) can be same or partially same as the driving transistor 362, and no further descriptions of specific manufacturing processes will be given here. For example, it should be noted that those skilled in the art should understand that other indispensable components of the display panel 300 (for example, a capacitor) may adopt conventional and suitable components, no further descriptions will be given here and it should not be construed as a limitation on the embodiments of the present disclosure.

For example, the fourth embodiment of the present disclosure may manufacture the display panel having the touch function with a single set of back panel tape out processes, and may simplify the manufacturing processes of the display panel having the touch function by forming the semiconductor layers of the light-sensing transistor, the driving transistor and the switching transistor in same one process, forming the passivation layers of the light-sensing transistor, the driving transistor and the switching transistor in same one process, and forming the source/drain metal layers of the light-sensing transistor, the driving transistor and the switching transistor in same one process.

It is apparent that the present disclosure can be changed and modified by those skilled in the art without departure from the spirit and scope of the disclosure, if the above-mentioned changes and modifications of the present disclosure belong to the scope of the claims of the present disclosure and its equivalent technologies, the present disclosure is intended to include the above changes and modifications.

What are described above is related to the illustrative embodiments of the disclosure only and not limitative to the scope of the disclosure; the scopes of the disclosure are defined by the accompanying claims.

What is claimed is:
1. A pixel circuit, comprising:
a light-emitting element;
a light-emitting control circuit, which is electrically connected to the light-emitting element and is configured to drive the light-emitting element to emit light;
a touch detection circuit, which is configured to determine whether or not a touch action occurs based on intensity of light incident onto the touch detection circuit; and
a signal line, which is configured to be electrically connected to an input terminal of the light-emitting control circuit and an output terminal of the touch detection circuit;

wherein the touch detection circuit comprises a sensing element and the sensing element is configured to convert light incident onto the sensing element into a sensed electrical signal;

the touch detection circuit further comprises an amplification circuit, and the amplification circuit is configured to amplify the sensed electrical signal outputted by the sensing element so as to improve signal-to-noise ratio of a touch electrical signal outputted by the touch detection circuit;

the touch detection circuit comprises a first transistor, a second transistor, a third transistor, a first capacitor and a first node;

the first transistor serves as the sensing element, and a second terminal of the first transistor is electrically connected to the first node;

the amplification circuit comprises the second transistor and the first capacitor;

a control terminal of the second transistor is electrically connected to the first node, a first terminal of the second transistor is electrically connected to a first terminal of the third transistor, and a second terminal of the second transistor is electrically connected to a second terminal of the first capacitor;

a first terminal of the first capacitor is electrically connected to the first node; and a second terminal of the third transistor is electrically connected to the signal line.

2. The pixel circuit according to claim 1, wherein the light-emitting control circuit comprises:

a light-emitting driving circuit, which is configured to be able to drive the light-emitting element to emit light;

a light-emitting select circuit, which is configured to be able to write a data signal into a control terminal of the light-emitting driving circuit selectively; and a second capacitor, which is configured to store the data signal and to keep the data signal at the control terminal of the light-emitting driving circuit.

3. The pixel circuit according to claim 2, wherein the light-emitting control circuit further comprises a second node;

the light-emitting driving circuit comprises a fourth transistor, a control terminal of the fourth transistor is electrically connected to the second node, a first terminal of the fourth transistor is electrically connected to a second terminal of the light-emitting element, and a second terminal of the fourth transistor is configured to be electrically connected to a first power source terminal;

the light-emitting select circuit comprises a fifth transistor, a first terminal of the fifth transistor is electrically connected to a first terminal of the signal line, and a second terminal of the fifth transistor is electrically connected to the second node;

a first terminal of the second capacitor is electrically connected to the second node, and a second terminal of the second capacitor is electrically connected to the second terminal of the fourth transistor; and a first terminal of the light-emitting element is electrically connected to a second power source terminal.

4. The pixel circuit according to claim 1, wherein the touch detection circuit comprises the first transistor, and the light-emitting control circuit comprises the fourth transistor; and the first transistor is a bottom-gate transistor, the fourth transistor is a top-gate transistor, and an active layer of the first transistor and an active layer of the fourth transistor are formed in same one layer.

5. A display panel, comprising:

a plurality of pixel units, which are arrayed, and a write-read-select circuit; and at least one of the pixel units comprises a pixel circuit;

wherein the pixel circuit comprises:
 a light-emitting element;
 a light-emitting control circuit, which is electrically connected to the light-emitting element and is configured to drive the light-emitting element to emit light;
 a touch detection circuit, which is configured to determine whether or not a touch action occurs based on intensity of light incident onto the touch detection circuit; and
 a signal line, which is configured to be electrically connected to an input terminal of the light-emitting control circuit and an output terminal of the touch detection circuit;

the write-read-select circuit comprises a first terminal, a second terminal and a third terminal, the third terminal is electrically connected to the signal line of the pixel circuit, the first terminal is able to be electrically connected to a data driving circuit, and the second terminal is able to be electrically connected to a touch driving circuit; and the write-read-select circuit is configured to be able to connect the first terminal to the third terminal or to connect the second terminal to the third terminal.

6. The display panel according to claim 5, wherein the write-read-select circuit is configured to:

electrically connect the first terminal to the third terminal in a display stage, so as to input a display data signal into the light-emitting control circuit of the pixel circuit through the signal line of the pixel circuit; and electrically connect the second terminal to the third terminal in a light-sensed-value reading stage, so as to read a touch electrical signal outputted by the touch detection circuit of the pixel circuit through the signal line of the pixel circuit.

7. The display panel according to claim 5, wherein the write-read-select circuit comprises a first control transistor and a second control transistor;

a first terminal of the first control transistor is electrically connected to the signal line of the pixel circuit and a second terminal of the first control transistor is configured to be able to be electrically connected to the data driving circuit; and a first terminal of the second control transistor is electrically connected to the signal line of the pixel circuit and a second terminal of the second control transistor is configured to be able to be electrically connected to the touch driving circuit.

8. The display panel according to claim 7, further comprising the touch driving circuit and the data driving circuit, wherein the second terminal of the first control transistor is electrically connected to the data driving circuit; and the second terminal of the second control transistor is electrically connected to the touch driving circuit.

9. The display panel according to claim 5, further comprising a voltage select circuit, wherein the voltage select circuit is configured to electrically connect an input terminal of the touch detection circuit of the pixel circuit to a first input power source or a second input power source.

10. The display panel according to claim 9,
wherein the voltage select circuit comprises a third control transistor and a fourth control transistor;
a first terminal of the third control transistor is electrically connected to the input terminal of the touch detection circuit of the pixel circuit and a second terminal of the third control transistor is configured to be able to be electrically connected to the first input power source; and
a first terminal of the fourth control transistor is electrically connected to the input terminal of the touch detection circuit of the pixel circuit and a second terminal of the fourth control transistor is configured to be able to be electrically connected to the second input power source.

11. The display panel according to claim 5, wherein all pixel units in at least one column each comprise the pixel circuit and share same one signal line.

12. A driving method for the display panel according to claim 5, comprising:

in a display stage, inputting a display data signal to the light-emitting control circuit of the pixel circuit through the signal line of the pixel circuit, so as to drive the pixel circuit to emit light; and in a light-sensed-value reading stage, reading a touch electrical signal outputted by the touch detection circuit of the pixel circuit through the signal line of the pixel circuit, so as to determine whether or not a touch action occurs.

13. The driving method for the display panel according to claim 12, wherein the display stage comprises a reset stage and a sensing stage, and the driving method further comprises:

in the reset stage, writing a first voltage into an input terminal of the touch detection circuit of the pixel circuit; and in the sensing stage, writing a second voltage into the input terminal of the touch detection circuit of the pixel circuit, wherein the second voltage is smaller than the first voltage.

* * * * *